(12) United States Patent
Song et al.

(10) Patent No.: US 8,589,774 B1
(45) Date of Patent: *Nov. 19, 2013

(54) AVERAGING SIGNALS TO IMPROVE SIGNAL INTERPRETATION

(71) Applicants: Hongxin Song, Sunnyvale, CA (US); Zining Wu, Los Altos, CA (US)

(72) Inventors: Hongxin Song, Sunnyvale, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/745,655

(22) Filed: Jan. 18, 2013

Related U.S. Application Data

(63) Continuation of application No. 13/445,712, filed on Apr. 12, 2012, now Pat. No. 8,359,527, which is a continuation of application No. 10/600,419, filed on Jun. 20, 2003, now Pat. No. 8,161,361.

(60) Provisional application No. 60/458,359, filed on Mar. 27, 2003, provisional application No. 60/443,341, filed on Jan. 28, 2003.

(51) Int. Cl.
*H03M 13/03* (2006.01)

(52) U.S. Cl.
USPC .............. 714/795; 714/822; 360/54; 360/67

(58) Field of Classification Search
USPC ............ 714/795, 822; 375/76, 94; 360/39–54
See application file for complete search history.

(56) References Cited

U.S. PATENT DOCUMENTS

| | | | |
|---|---|---|---|
| 5,081,547 A | 1/1992 | Howell | |
| 5,255,136 A | 10/1993 | Machado et al. | |
| 5,291,198 A | 3/1994 | Dingwall et al. | |
| 5,329,554 A | 7/1994 | Behrens et al. | |
| 5,610,776 A | 3/1997 | Oh | |
| 6,009,549 A | 12/1999 | Bliss et al. | |
| 6,038,091 A | 3/2000 | Reed et al. | |
| 6,151,179 A | 11/2000 | Poss | |
| 6,163,517 A | 12/2000 | Kim et al. | |
| 6,384,999 B1 | 5/2002 | Schibilla | |
| 6,424,476 B1 | 7/2002 | Matsubara et al. | |
| 6,493,165 B1 | 12/2002 | Satoh et al. | |

(Continued)

FOREIGN PATENT DOCUMENTS

EP 1271509 A1 1/2003

OTHER PUBLICATIONS

Hanson, W., "Hard Disk Drives," Feb. 1999, IEEE, Southern Minnesota Section Newsletter.

(Continued)

*Primary Examiner* — Sam Rizk

(57) ABSTRACT

Systems and techniques to interpret signals on a noisy channel are described. A described technique includes storing a group of signals including a filtered digital signal and one or more previous signals, the filtered digital signal being based on an analog signal; interpreting the filtered digital signal as first discrete values; determining whether the first discrete values are adequately indicated based on a result of the interpreting; initiating a retry mode when the first discrete values are not adequately indicated; producing, in the retry mode, a new signal, the new signal being determined based on an average of at least a portion of the group of signals; interpreting, in the retry mode, the new signal as second discrete values; and determining whether the second discrete values are adequately indicated based on hard decisions indicated by the new signal and hard decisions indicated by the filtered digital signal.

20 Claims, 3 Drawing Sheets

(56) References Cited

U.S. PATENT DOCUMENTS

| | | |
|---|---|---|
| 6,519,715 B1 | 2/2003 | Takashi et al. |
| 7,050,252 B1 | 5/2006 | Vallis |
| 7,136,244 B1 | 11/2006 | Rothberg |
| 7,843,660 B1 | 11/2010 | Yeo |
| 8,161,361 B1 | 4/2012 | Song et al. |
| 2003/0147168 A1 | 8/2003 | Galbraith et al. |

OTHER PUBLICATIONS

Pai, P., "Equalization & Clock Recovery in Magnetic Storage Read Channels," a dissertation, Dec. 1996, UCLA, Electrical Engineering Department.

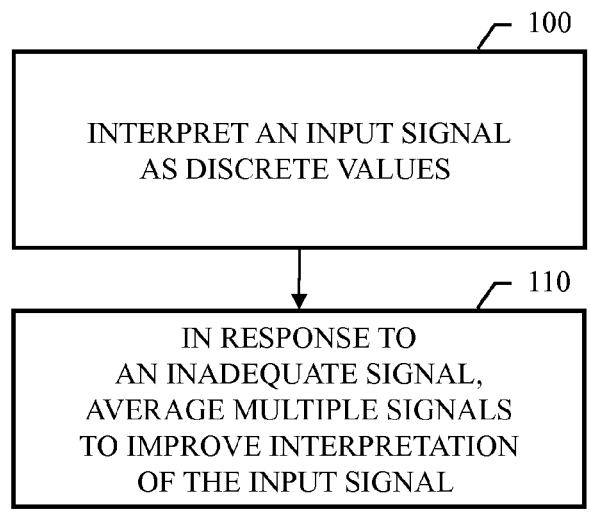
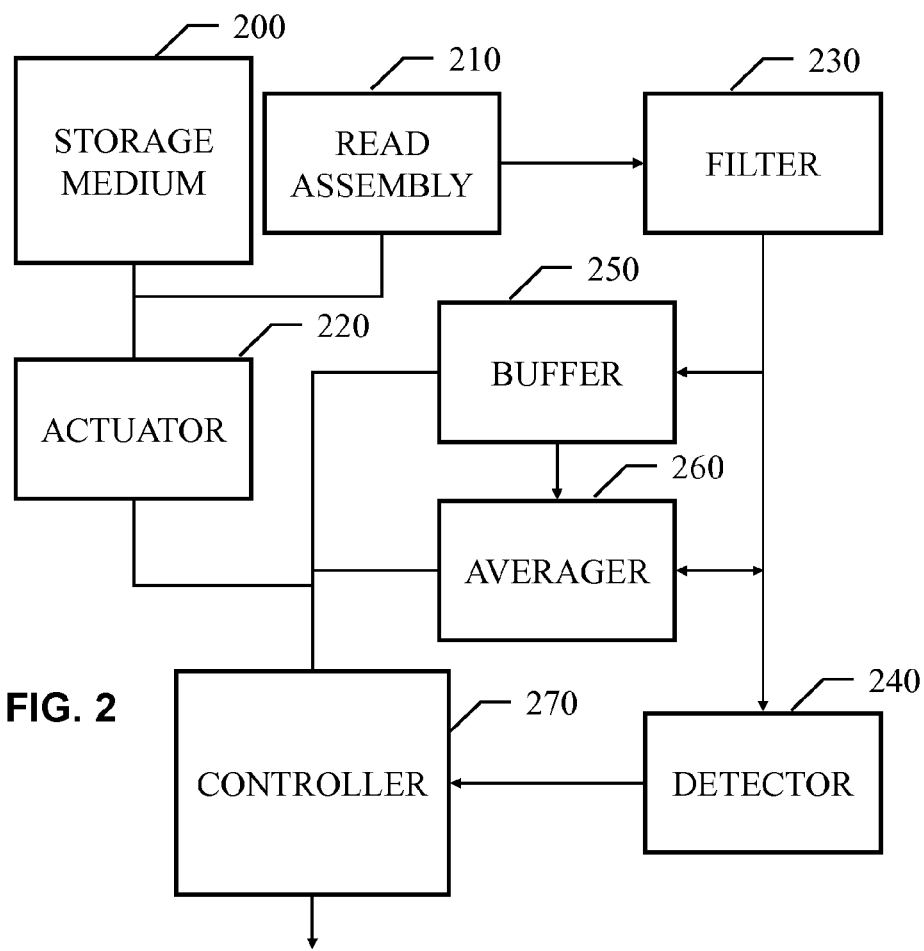

AVERAGING SIGNALS TO IMPROVE SIGNAL INTERPRETATION

CROSS-REFERENCE TO RELATED APPLICATIONS

This patent document is a continuation of, and claims the benefit of priority of U.S. application Ser. No. 13/445,712, filed Apr. 12, 2012 and entitled "Averaging Signals to Improve Signal Interpretation" (now U.S. Pat. No. 8,359,527), which is a continuation of and claims the benefit of the priority of U.S. application Ser. No. 10/600,419, filed Jun. 20, 2003 and entitled "Averaging Signals to Improve Signal Interpretation" (now U.S. Pat. No. 8,161,361), which claims the benefit of the priority of (i) U.S. Provisional Application Ser. No. 60/443,341, filed Jan. 28, 2003 and entitled "Improvement The Performance in Retry Mode"; and (ii) U.S. Provisional Application Ser. No. 60/458,359, filed Mar. 27, 2003 and entitled "Improvement The Performance in Retry Mode".

TECHNICAL FIELD

The present disclosure describes systems and techniques relating to signal processing, for example, interpreting read signals obtained from a magnetic storage medium.

BACKGROUND

Signal processing circuits are frequently used to read storage media and interpret obtained analog signals as discrete values stored on the media. Analog signal are often obtained from magnetic storage media. A transducer head may fly on a cushion of air over a magnetic disk surface. The transducer converts magnetic field variations into an analog electrical signal. The analog signal is amplified, converted to a digital signal and interpreted (e.g., using maximum likelihood techniques, such as using a Viterbi decoder). Tracking of stored data during a read operation is frequently performed using feedback or decision aided gain and timing control.

Increasing the amount of data stored on a magnetic medium can result in an increased error-rate unless error detection and correction techniques are used to compensate. If a read signal from a unit of storage (e.g., a cluster or a sector) on a disk cannot be interpreted adequately, typically the storage unit is read again one or more times to obtain a signal that can be interpreted, or to determine that there is a disk error.

SUMMARY

The present disclosure includes systems and techniques relating to interpreting signals on a noisy channel. According to an aspect, an input signal can be interpreted as discrete values. In response to an inadequate signal, multiple signals can be averaged to improve interpretation of the input signal. The input signal can be a read signal from a storage medium, such as those found in disk drives. A read channel can include a buffer and an averaging circuit capable of different signal averaging approaches in a retry mode, including making signal averaging decisions based on a signal quality measure. Buffering read signals can be done in alternative locations in the read channel and can involve buffering of many prior read signals and/or buffering of an averaged read signal.

Averaging read signals in a retry mode, such as by averaging sampled digital signals, can result in reduced signal variance and noise. Many different sources of noise can be addressed, including noise created by an off-track (OT) condition in a hard drive. When using these techniques to obtain the desired signal, higher signal to noise ratios (SNR) can be achieved and storage devices with greater storage capacity can be created. The systems and techniques described here can be combined with various signal processing and error detection and correction techniques, including techniques applied to signal detector output to address noise issues.

Details of one or more implementations are set forth in the accompanying drawings and the description below. Other features, objects and advantages may be apparent from the description and drawings, and from the claims.

DRAWING DESCRIPTIONS

FIG. 1 is a flowchart illustrating signal averaging in response to an inadequate signal.

FIG. 2 is a block diagram showing a storage device that uses signal averaging.

Like reference symbols in the various drawings indicate like elements.

DETAILED DESCRIPTION

Figure 3:
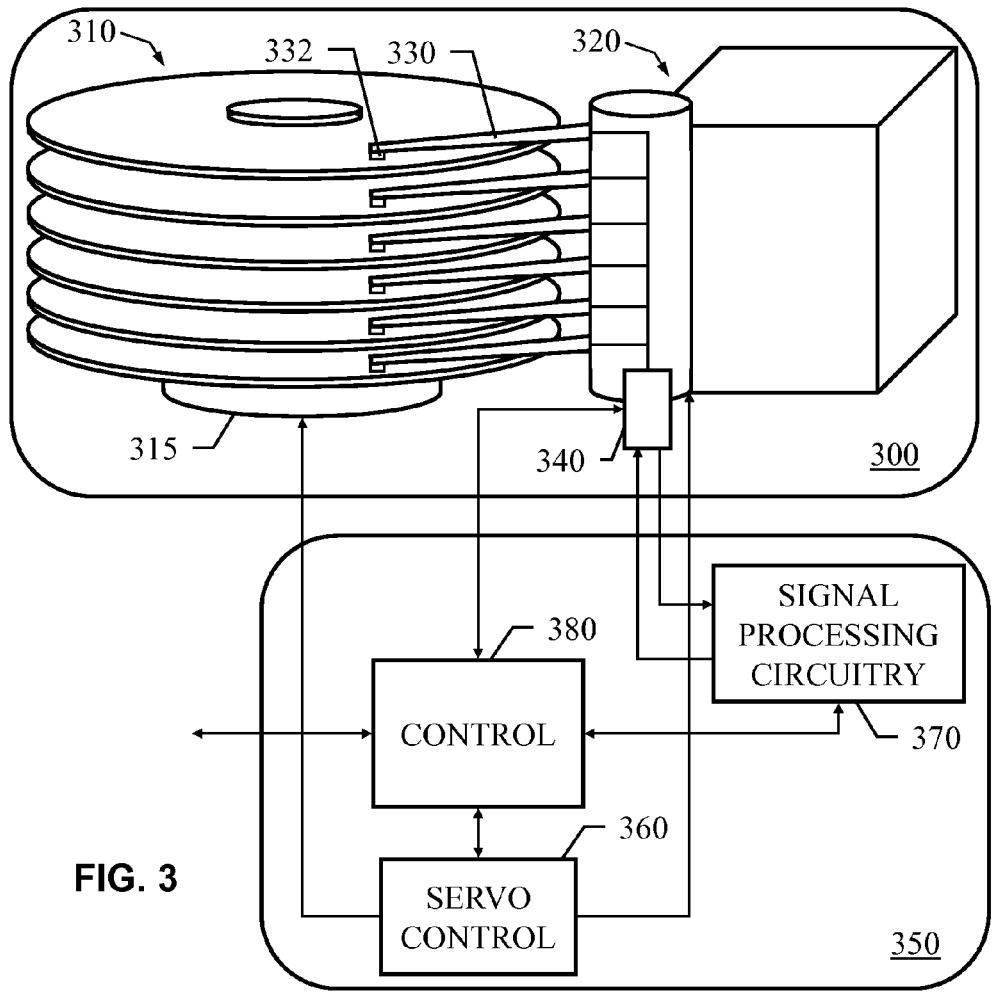
FIG. 3 shows a magnetic-media disk drive that uses signal averaging in a retry mode.

FIG. 1 is a flowchart illustrating signal averaging in response to an inadequate signal. An input signal can be from any channel or media. The input signal is interpreted as discrete values at 100. The input signal generally includes noise, and interpreting this signal involves finding the desired signal (without noise) in the input signal. When the desired signal cannot be determined from the input signal with sufficient certainty, the input signal can be considered inadequate or ambiguous. The level of certainty needed for an input signal can depend on the channel/media, the signal detection techniques, and any post-processing techniques used.

The input signal is a waveform x(t) that represents the result of reading data on a channel or media. The waveform generally includes the desired signal s(t) and noise n(t). The noise n(t) can be additive white noise. Other types of noise can be present in the waveform x(t) as well, such as media noise m(t), which is generally correlated and data dependent, corresponding to a medium being read.

As the waveform x(t) is interpreted, a determination is made as to whether the input signal adequately indicates the discrete values. When there is excessive noise in the input signal, the signal can be rejected as inadequate. In response to an inadequate signal, multiple signals are averaged to improve interpretation of the input signal at 110. For example, when an input signal has too much noise, a new signal can be obtained for the same data, the two obtained signals can be averaged together, and the averaged signal can be interpreted as discrete values.

Newly obtained signals for the same data have the same desired signal s(t) but a different noise component n(t) Thus, in a data storage implementation, the first input signal can be defined as:

$$x_1(t)=s(t)+m(t)+n_1(t), \quad (1)$$

and the second input signal can be defined as:

$$x_2(t)=s(t)+m(t)+n_2(t), \quad (2)$$

where $x_i(t)(i=1,2)$ is the readback waveform, s(t) is the desired signal, m(t) is the media noise, and $n_i(t)$ (i=1,2) is the random noise. Taking the average of $x_1(t)$ and $x_2(t)$, gives:

$$\overline{x}(t) = \frac{1}{2}[x_1(t) + x_2(t)] = s(t) + m(t) + \frac{1}{2}[n_1(t) + n_2(t)]. \quad (3)$$

Let $$\overline{n}(t) = \frac{1}{2}[n_1(t) + n_2(t)],$$

then the variance $$\sigma_{\overline{n}}^2 = \frac{1}{2}\sigma_n^2.$$

Assuming that additive white noise makes one third of total noise power, then $\overline{x}(t)$ can provide 0.79 dB gain over either $x_1(t)$ or $x_2(t)$.

The averaging can be performed in a retry mode when a first attempt to read specific data on a channel or media has failed. In the retry mode, a new read is performed. The decision of whether the discrete values are adequately indicated in the retry mode can be based on just the averaged signal $\overline{x}(t)$, which can be the average of all the i read attempts or the average of the last q read attempts (e.g., q=3). The decision of whether the discrete values are adequately indicated in the retry mode can be based on both the averaged signal $\overline{x}(t)$ and the most recent signal $x_i(t)$. For example, if the hard decisions based on $x_i(t)$ and $\overline{x}(t)$ differ, this can be used as an indication of an error.

FIG. 2 is a block diagram showing a storage device that uses signal averaging. The storage device includes a storage medium 200, which can be read-only or read/write media and can be magnetic-based, optical-based, semiconductor-based media, or a combination of these. Examples of the storage medium 200 include hard disk platters in a hard disk drive, a floppy disk, a tape, and an optical disc (e.g., laser disk, compact disc, digital versatile disk).

The storage device includes a read assembly 210 that reads the storage media 200 under the control of an actuator 220 (e.g., a servo). A read signal is generated and provided to a filter 230. The filter 230 can convert the input signal from analog to digital and/or equalize the input signal. The result can then be provided to a detector 240. A peak-detection system can be used, and various amplifiers, automatic gain control (AGC), and threshold detection circuits can also be used. Partial-response equalization can be combined with maximum-likelihood sequence detection (PRML), using either a discrete-time approach or a continuous-time approach (e.g., the class-IV partial response target (PR-IV)). Moreover, timing control circuitry can be used to regulate the filtered signal provided to the detector 240.

The filtered signal is also provided to a buffer 250 that stores input signals for later use. The output of the detector 240 is provided to a controller 270 that controls read operations in the storage device. If a read signal is inadequate, the controller 270 can enter the device into a retry mode where the same data is read again. This later read signal for the data is averaged with the read signal stored in the buffer 250, using an averager 260, and the result is supplied to the detector 240.

Averaging of signals can be performed at many different points in a retry mode. A new read signal can be obtained after each failure to detect an adequate signal. Adequate signal detection can be based on an average signal composed of the most recent read signals averaged together (e.g., the last two or three read signals averaged together). Alternatively, a running average of all past read signals can be maintained, and each new read signal can be averaged with the stored averaged read signal before detection.

Determining whether the discrete values are adequately indicated can involve comparing interpretations of the averaged read signal and a current read signal. If the discrete values indicated by the averaged signal differ from values indicated by the current read signal, this can be used as an indication of an error. This error indication can be provided to error correction circuitry for further processing.

A quality monitor can be used to measure signal quality for use in reading the data. The quality measure can be based on a defined signal characteristic. Averaging can be based on the quality measure, such as by excluding a read signal with a low quality measure from the averaging, or such as by performing weighted averaging, where the weights are given by the quality measure.

A Viterbi detector and an error correction circuit (ECC) can be used. The ECC can be used to correct errors and to determine read signal quality based on a Viterbi metric. The averaging circuit can have a quality measure as an input to determine if a particular read signal should be kept (e.g., include or exclude samples based on the Viterbi metric).

The signal averaging systems and techniques described here can be combined with various signal processing and error detection and correction techniques. For example, in a storage device, bit-error-rate (BER) improvements obtained by averaging signals can be carried through a post-processor, such as a media noise processor (MNP), that processes detector output.

FIG. 3 shows a magnetic-media disk drive that uses signal averaging in a retry mode. The disk drive includes a head-disk assembly (HDA) 300 and drive electronics 350 (e.g., a printed circuit board (PCB) with semiconductor devices). The HDA 300 includes several disks 310 mounted on an integrated spindle and motor assembly 315. The motor assembly 315 rotates the disks 310 under read-write heads connected with a head assembly 320 in the HDA 300. The disks 310 can be coated with a magnetically hard material (e.g., a particulate surface or a thin-film surface) and can be written to or read from a single side or both sides of each disk.

A head 332 on an arm 330 can be positioned as needed to read data on the disk. A motor (e.g., a voice coil motor or a stepper motor) can be used to position the heads over the desired track(s). The arm 330 can be a pivoting or sliding arm and can be spring-loaded to maintain a proper flying height for the head 332 in any drive orientation. A closed-loop head positioning system can be used.

The HDA 300 can include a read-write chip 340, where head selection and sense current value(s) can be set. The read-write chip 340 can amplify a read signal before outputting it to signal processing circuitry 370. The signal processing circuitry 370 can include a read signal circuit, a servo signal processing circuit, and a write signal circuit.

Signals between the HDA 300 and the drive electronics 350 can be carried through a flexible printed cable. A controller 380 can direct a servo controller 360 to control mechanical operations, such as head positioning through the head assembly 320 and rotational speed control through the motor assembly 315. The controller 380 can be one or more integrated circuit (IC) chips (e.g., a combo chip). The controller 380 can be a microprocessor and a hard disk controller. The drive electronics 350 can also include various interfaces, such as a host-bus interface, and memory devices, such as a read only memory (ROM) for use by a microprocessor, and a random access memory (RAM) for use by a hard disk controller. The hard disk controller can include error correction circuitry.

The HDA 300 and drive electronics 350 can be closed in a sealed container with an integral air filter. For example, the hard disk drive can be assembled using a Winchester assembly. The rotating platter can be driven by a brush-less DC motor, and the rotational frequency can be accurately servo-locked to a crystal reference.

Figure 4:
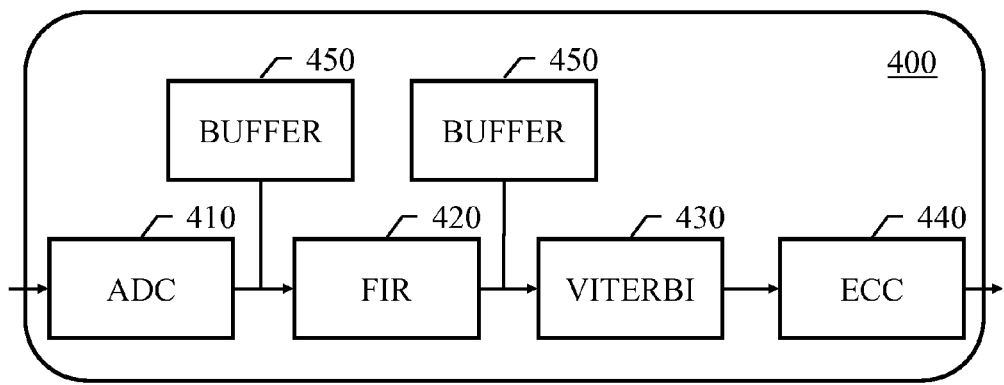
FIG. 4 shows a signal processing apparatus that can implement a signal averaging retry mode in a storage device.

FIG. 4 shows a signal processing apparatus 400 that can implement a signal averaging retry mode in a storage device. The apparatus 400 includes a read channel, which can be implemented as one or more devices (e.g., one or more IC devices) in a storage device. An input signal is provided to an ADC 410. The input signal may be an amplified signal (e.g., a read signal amplified both by a pre-amplifier and a variable-gain amplifier (VGA), which can be regulated by an AGC). The input signal can also be at least partially equalized, such as by using a programmable continuous-time filter before the ADC 410.

The ADC 410 converts the analog input to digital output. The ADC 410 can be a 6-bit ADC. The output of the ADC 410 can be provided to a finite impulse response (FIR) digital filter 420, which shapes the signal to the target used by a Viterbi detector 430. The FIR 420 can be a 9-tap FIR, and can be programmable or adaptive.

Errors in sampling phase can be sensed, and the phase can be corrected using a phase locked loop (PLL). The equalized signal is provided to the Viterbi detector 430, which decodes the waveform to find the true signal. An ECC 440 can be used to identify errors and correct them when possible.

The averaging operation can be performed after analog to digital conversion or after digital equalization to the same effect. Thus, a buffer 450 can be placed in the read channel after analog to digital conversion (e.g., after the ADC 410) or after digital equalization (e.g., after the FIR 420). The buffer 450 is shown in both positions in FIG. 4 for illustration. In general, placing the buffer 450 after the ADC 410 instead of the FIR 420 can result in reduced memory requirements (e.g., a reduced bit width for storage of the data). Any number of storage units can be buffered (e.g., buffering can be done one disk sector at a time), depending on a given storage device and the nature of the retry mode operations to be implemented.

Figure 5:
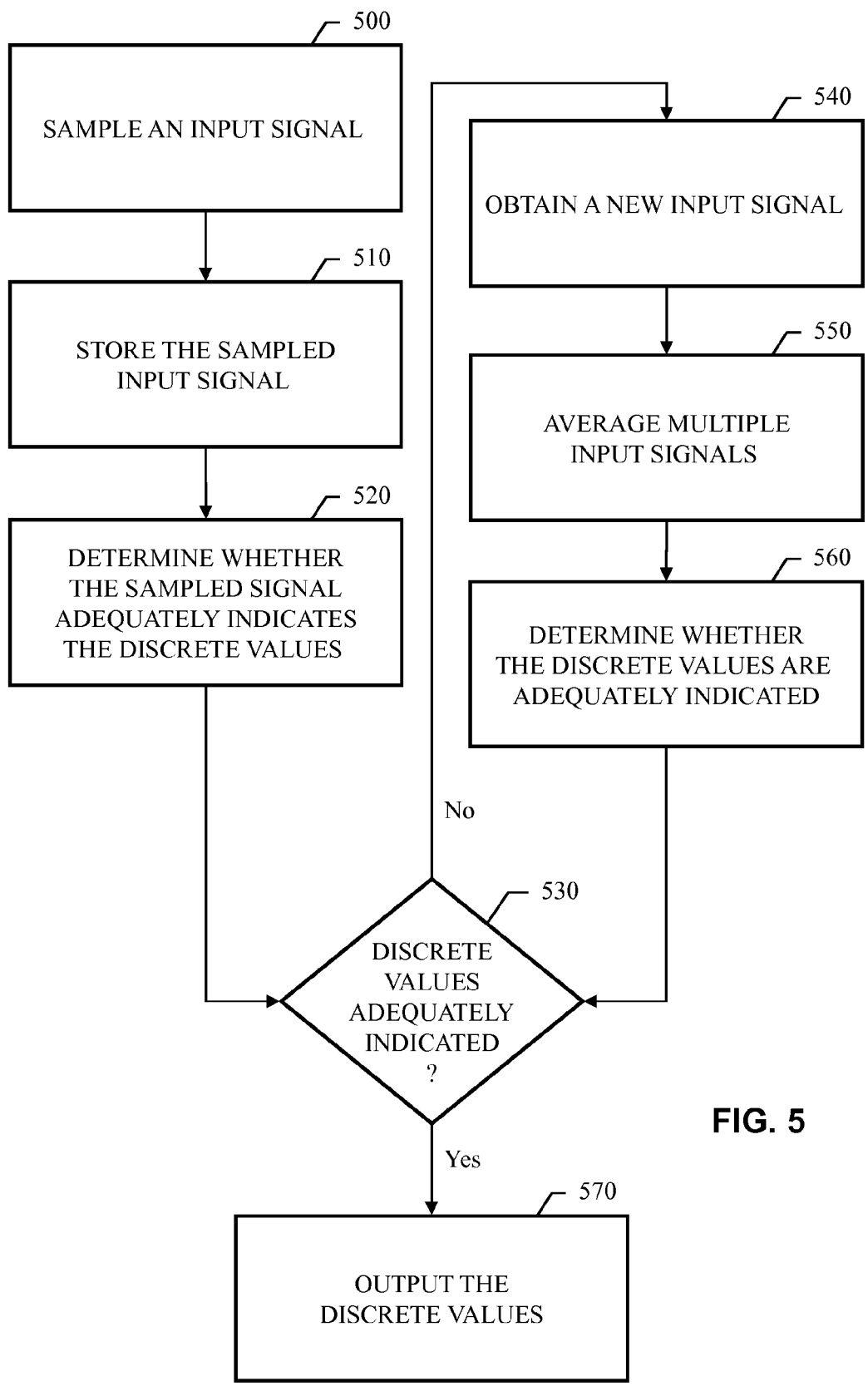
FIG. 5 is a flowchart illustrating signal averaging in a retry mode.

FIG. 5 is a flowchart illustrating signal averaging in a retry mode. An input signal can be sampled at 500. Sampling the input signal can involve converting the input signal to a digital signal and filtering the digital signal based on finite impulse response. The sampled input signal can be stored at 510. Then, discrete values can be detected in the sampled input signal at 520. A determination can be made as to whether the sampled signal adequately indicates the discrete values.

If the discrete values are adequately indicated at 530, the discrete values can be output at 570. If the discrete values are not adequately indicated, a retry mode can be entered. A new input signal can be obtained at 540. Multiple input signals are averaged at 550. Then, a determination can be made as to whether the discrete values are adequately indicated based on the averaged signal at 560.

The signals that are averaged can vary. In a storage device, the data portion (e.g., the portion right after a sync mark) of the ADC output of the two read back waveforms can be averaged. When new signals are repeatedly obtained in the retry mode, the most recent X signals can be averaged (e.g., the most recent three signals), or a current signal can be averaged with a stored average of all previous obtained signals. Moreover, obtained signals can be excluded from the averaging based on a signal quality metric, such as described above.

Determining whether the discrete values are adequately indicated based on the averaged signal can involve different types of comparisons. The averaged signal can be interpreted directly, and the determination can be based solely on the interpreted averaged signal. Alternatively, the determination can involve a comparison of interpretations of the averaged signal and of the current signal. For example, hard decisions from $x_2(t)$ and $\bar{x}(t)$ can be compared after run length limited (RLL) decoding, and erasures can be marked wherever there is discrepancy; these erasures can be provided to an ECC for further processing.

A few embodiments have been described in detail above, and various modifications are possible. Thus, other embodiments may be within the scope of the following claims.

What is claimed is:

1. A signal processing apparatus comprising:
   a memory device configured to store a group of signals comprising a filtered digital signal and one or more previous signals, the filtered digital signal being based on an analog signal;
   a detector to interpret the filtered digital signal as first discrete values;
   a controller configured to determine whether the first discrete values are adequately indicated based on an output of the detector, and initiate a retry mode when the first discrete values are not adequately indicated; and
   an averager that is communicatively coupled with the memory device to produce a new signal in the retry mode, the new signal being determined based on an average of at least a portion of the group of signals,
   wherein the detector is configured to interpret the new signal as second discrete values in the retry mode,
   wherein the controller is configured to determine whether the second discrete values are adequately indicated based on hard decisions indicated by the new signal and hard decisions indicated by the filtered digital signal.

2. The apparatus of claim 1, wherein the analog signal is based on a read signal received from a storage medium.

3. The apparatus of claim 1, further comprising:
   circuitry that is communicatively coupled with the detector and the averager to provide a signal quality metric that is based on the output of the detector, wherein the controller is configured to use the signal quality metric to selectively exclude a signal of the group of signals from the average.

4. The apparatus of claim 1, wherein the filtered digital signal is produced via a finite impulse response (FIR) digital filter.

5. The apparatus of claim 1, wherein the detector uses a maximum likelihood technique to interpret input signals.

6. The apparatus of claim 1, wherein the average is based on a weighted average of the one or more previous signals and the filtered digital signal, and wherein the weighted average is based on weights respectively associated with the one or more previous signals and the filtered digital signal.

7. The apparatus of claim 6, wherein the weights are based on respective signal quality measures, and wherein the signal quality measures are based on respective outputs of the detector.

8. A method comprising:
- storing a group of signals comprising a filtered digital signal and one or more previous signals, the filtered digital signal being based on an analog signal;
- interpreting the filtered digital signal as first discrete values;
- determining whether the first discrete values are adequately indicated based on a result of the interpreting;
- initiating a retry mode when the first discrete values are not adequately indicated;
- producing, in the retry mode, a new signal, the new signal being determined based on an average of at least a portion of the group of signals;
- interpreting, in the retry mode, the new signal as second discrete values; and
- determining whether the second discrete values are adequately indicated based on hard decisions indicated by the new signal and hard decisions indicated by the filtered digital signal.

9. The method of claim 8, further comprising:
- generating a signal quality metric based on a signal interpretation, wherein producing the new signal comprises using the signal quality metric to selectively exclude a signal of the group of signals from the average.

10. The method of claim 8, further comprising:
- receiving a read signal that is responsive to a storage medium, wherein the analog signal is based on the read signal.

11. The method of claim 8, further comprising:
- using a finite impulse response (FIR) digital filter to produce the filtered digital signal.

12. The method of claim 8, wherein interpreting the filtered digital signal comprises using a maximum likelihood technique.

13. The method of claim 8, wherein the average is based on a weighted average of the one or more previous signals and the filtered digital signal, wherein the weighted average is based on weights respectively associated with the one or more previous signals and the filtered digital signal.

14. The method of claim 13, further comprising:
- generating signal quality measures based on signal interpretations, wherein the weights are based on the signal quality measures, respectively.

15. A system comprising:
- a memory device configured to store a group of signals comprising a filtered digital signal and one or more previous signals, the filtered digital signal being based on an analog signal; and
- circuitry configured to perform operations comprising:
  - interpreting the filtered digital signal as first discrete values;
  - determining whether the first discrete values are adequately indicated based on a result of the interpreting;
  - initiating a retry mode when the first discrete values are not adequately indicated;
  - producing, in the retry mode, a new signal, the new signal being determined based on an average of at least a portion of the group of signals;
  - interpreting, in the retry mode, the new signal as second discrete values; and
  - determining whether the second discrete values are adequately indicated based on hard decisions indicated by the new signal and hard decisions indicated by the filtered digital signal.

16. The system of claim 15, the operations further comprising:
- generating a signal quality metric based on a signal interpretation, wherein producing the new signal comprises using the signal quality metric to selectively exclude a signal of the group of signals from the average.

17. The system of claim 15, the operations further comprising:
- receiving a read signal that is responsive to a storage medium, wherein the analog signal is based on the read signal.

18. The system of claim 15, wherein interpreting the filtered digital signal comprises using a maximum likelihood technique.

19. The system of claim 15, wherein the average is based on a weighted average of the one or more previous signals and the filtered digital signal, wherein the weighted average is based on weights respectively associated with the one or more previous signals and the filtered digital signal.

20. The system of claim 19, the operations further comprising:
- generating signal quality measures based on signal interpretations, wherein the weights are based on the signal quality measures, respectively.

* * * * *